United States Patent [19]

Yamamoto et al.

[11] Patent Number: 4,504,567

[45] Date of Patent: Mar. 12, 1985

[54] LIGHT-SENSITIVE LITHOGRAPHIC PRINTING PLATE

[75] Inventors: Takeshi Yamamoto; Kiyoshi Goto, both of Hino, Japan

[73] Assignee: Konishiroku Photo Industry Co., Ltd., Tokyo, Japan

[21] Appl. No.: 639,539

[22] Filed: Aug. 9, 1984

Related U.S. Application Data

[63] Continuation of Ser. No. 368,400, Apr. 14, 1982, abandoned.

[30] Foreign Application Priority Data

Apr. 27, 1981 [JP]  Japan .................................. 56-62341

[51] Int. Cl.³ .......................... G03C 1/52; G03C 1/68
[52] U.S. Cl. .................................... 430/165; 430/167; 430/275; 430/191; 430/196; 430/169; 430/270; 430/271; 430/285; 430/286; 430/283; 430/906; 430/908; 430/631; 430/638; 430/635; 430/636
[58] Field of Search ............... 430/169, 191, 177, 270, 430/271, 281, 283, 285, 906, 908, 286, 631, 302, 638, 635, 636, 165, 167, 275, 935

[56] References Cited

U.S. PATENT DOCUMENTS

| | | | |
|---|---|---|---|
| 3,620,743 | 11/1971 | Notley .................. | 430/152 |
| 3,754,924 | 8/1973 | De Geest et al. .................. | 430/635 |
| 3,779,768 | 12/1973 | Cope et al. .................. | 430/179 |
| 4,050,940 | 9/1977 | Habu et al. .................. | 430/638 |

FOREIGN PATENT DOCUMENTS 54-135004  10/1979  Japan .

OTHER PUBLICATIONS

*Journal of the SMPTE*, "A New Heat-Developable Motion-Picture Print Film", Noel R. Bacon et al., vol. 73, pp. 213-215, (1964).
*Photographic Science and Engineering*, "The Kalvar Process", W. A. Seifert et al., vol. 5, pp. 235-238, (1961).

*Primary Examiner*—Won H. Louie
*Attorney, Agent, or Firm*—Frishauf, Holtz, Goodman & Woodward

[57] ABSTRACT

The invention provides a light-sensitive lithographic printing plate containing a light-sensitive composition which has a different degree of solubility in an exposed area of said printing plate than in an unexposed area of said printing plate when said printing plate is developed in a developing solution. This printing plate is produced by a process which comprises coating on a support a solution prepared by dissolving a light-sensitive composition containing a light-sensitive material and at least one fluorinated surfactant having Formula (I) in a quantity of between 0.005% by weight and 0.05% by weight based on the weight of said composition, in at least one solvent having (A) a solubility parameter of at least $8(cal/cm^3)^{\frac{1}{2}}$, and (B) a boiling point within the range of from 100° to 200° C. Said Formula (I) is Rf-A-Y, wherein Rf is a partially or completely fluorinated hydrophobic alkyl moiety, A is a single bind or bivalent moiety and Y is a hydrophilic moiety.

15 Claims, No Drawings

LIGHT-SENSITIVE LITHOGRAPHIC PRINTING PLATE

This application is a continuation of application Ser. No. 368,400, filed Apr. 14, 1982, abandoned.

The present invention relates to a light-sensitive lithographic printing plate.

Light-sensitive lithographic printing plates may be obtained in the manner that a light-sensitive composition is dissolved into an appropriate solvent, and the solution is coated on a support and then dried, but if a light-sensitive layer not even in the thickness thereof is produced during the coating, there occurs a question of awkwardness such as doing harm to the value as a commodity thereof, and it causes the instabilities of the speed, of the reproduction of the half-tone, and of the press life thereof.

As means capable of providing an even light-sensitive layer, there have heretofore been mechanical or installational devices such as for controlling the drying air flow rate and temperatures in the drying process, but there are simpler and more convenient means including the addition of a cellulose alkyl ether as described in Japanese Patent Examined Publications No. 23571/1979 and No. 29922/1979; the addition of silicone oil as described in Japanese Patent Publication Open to Public Inspection (hereinafter referred to as Japanese Patent O.P.I. Publication) No. 2519/1977; and the addition of not less than 0.05% by weight of a macromolecular fluorinated surfactant having molecuar weight of not less than 10,000 as described in Japanese Patent O.P.I. Publication No. 135004/1979. However, for example, the addition of silicone oil causes the light-sensitive layer coating liquid to be repelled on the surface of the support to reduce the wetness. Cellulose alkyl ethers or macromolecular fluorinated surfactants are required to be added in a quantity of not less than 0.05% by weight as mentioned above in order to display an effect. In this case, the addition of such a large quantity promotes the swelling of the light-sensitive layer during the development after exposure and increases the adhesion between the light-sensitive layers, so that the development becomes a stripping development, and therefore the development cannot be made by washing alone and indispensably needs a treatment of physically rubbing out the layer. For this reason, there has been a disadvantage that a scumming tends to occur during printing due to the underdevelopment.

The uneven coating is generally assumed to be caused through such a mechanism that in the course of the drying of a light-sensitive layer, there occurs a large difference in temperature between the surface area and the area adjacent to the support of the light-sensitive layer, resulting in a temperature distribution inside the light-sensitive layer to cause locally the difference in surface tension, and the difference in surface tension triggers a convection to cause an uneven drying. Particularly in highly polar organic solvents, this trend is significantly high. Therefore, such highly polar solvents have made it difficult to obtain an even layer thickness through the coating and drying processes.

Accordingly, it is an object of the present invention to provide a light-sensitive lithographic printing plate which has no bad effect upon the developability and which has a layer with an even thickness to be obtained by coating and drying.

It is another object of the present invention to provide a light-sensitive lithographic printing plate having a layer with an even thickness to be obtained by coating and drying in a simple manner without devising any mechanical or installational means.

As a result of having devoted ourselves to studies to accomplish the above objects, we have reached the present invention, and the above objects of the present invention may be accomplished by a light-sensitive lithographic printing plate being produced by a process which comprises coating on a support thereof a solution prepared by dissolving a light-sensitive composition containing, a fluorinated surfactant having the formula (I) in a quantity of not less than 0.005% by weight and of less than 0.05% by weight to said composition and a light-sensitive material, into a solvent having (A) a solubility parameter of not less than $8[cal/cm^3]^{\frac{1}{2}}$, and (B) a boiling point within the range of from 100° to 200° C.

$$Rf—A—Y \qquad \text{Formula (I)}$$

Wherein Rf is a partially or completely fluorinated hydrophobic alkyl moiety and A is a bivalent joint moiety and Y is a hydrophilic moiety.

In accordance with a preferred embodiment of the present invention, at least 50% by weight of the solvent used in the coating is a solvent represented by the formula (II)

$$\begin{array}{l} R_1—O—CH_2 \\ \phantom{R_1—O—C}| \\ R_2—O—CH_2 \end{array} \qquad \text{Formula (II)}$$

wherein $R_1$ is hydrogen atom, an acetyl or a propionyl group, and $R_2$ is a hydrogen atom, a methyl, an ethyl, a butyl or a phenyl group.

Those compounds having Formula (I) (hereinafter referred to as the compound of the present invention) are described in further detail: preferably Rf is a fluorinated alkyl group having from 2 to 10 carbon atoms, and is more preferably to be a completely fluorinated alkyl group having from 6 to 9 carbon atoms. Preferably A is a single bond or a group selected from the group consisting of a carbonyl group, a sulfonyl group, an amino group, an arylene group, an alkylene group, an oxygen group and a group consisting not less than two of these groups such as sulfonylamino, carbonylamino, sulfonylaminoalkyl, carbonylaminoalkyl, sulfonylaminoalkylaryl. Y includes preferably an amino group such as the sulfonate type, carboxylate type, sulfate type, phosphate type, a cationic group such as ammonium salt type phosphonium salt type a betaine group including both cationic group such as ammonium and anionic group such as carboxylate ($—COO^-$), sulfonate ($—OSO_3^-$) or sulfate ($—SO_3^-$), or a nonionic group such as alkyleneoxide, acrylic ester, methacrylic ester or oligomer (polymer having the number of repeating units of from 2 to 20).

The compound of the present invention, as described in Japanese Patent Examined Publication No. 39291/1977, is known as the compound used as an antistatic agent in a silver halide photographic emulsion layer on a support having a gelatin-containing hydrophilic colloidal binder, but we have found that, in the present invention, the compound, in as small a quantity as less than 0.05% by weight, is capable of retaining a sufficient surface activity as well as of reducing the surface tension of the coating solvent to the support thereby to improve the wetness.

The adding amount of the compound of the present invention to a light-sensitive composition is within the range of not less than 0.005% by weight and less than 0.05% by weight to the said composition. If the adding amount is not less than 0.05% by weight, the amount has a reverse effect upon the developability, while if the adding amount is less than 0.005% by weight, the amount, because the effect thereof is too small, may not accomplish the object of the present invention. The compound of the present invention may be used either singly or in the form of a mixture; may be allowed to be used in combination with non-fluorinated surfactants, particularly hydrocarbon amphoteric surfactants such as alkyl-betaine type surfactants, Aerosol T, and the like within such a range as not to impair the effect of the present invention.

Typical examples of the compound of the present invention are enumerated below:

Exemplified Compound

[1] $C_7F_{15}C_2NH_4$
[2] $C_8F_{17}SO_2N(C_2H_5)CH_2COOK$
[3] $C_8F_{17}SO_2NHC_3H_6N^+(CH_3)_3Cl^-$
[4] $C_7F_{15}CONH(CH_2)_3N^+(CH_3)_2C_2H_4COO^-$
[5] $C_8F_{17}SO_2N(C_2H_5)C_2H_4(OC_3H_6)_5OH$
[6] $C_7F_{15}CONHC_3H_6N^+(CH_3)_2CH_2CH_2COO^-$

[7] 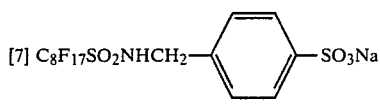

[8] 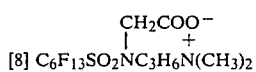

[9] 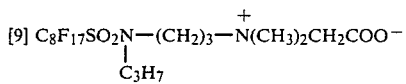

[10] $C_8F_{17}SO_2NHC_3H_6N^+(CH_3)_2C_2H_5OSO_2OC_2H_5$
[11] $C_7F_{15}CONHC_3H_6N^+(CH_3)_3C^-$

[12] 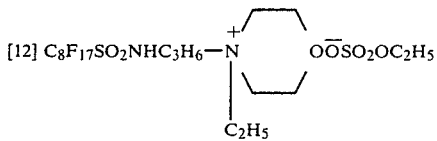

[13] 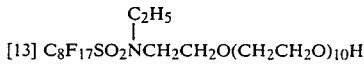

[14] $C_8F_{17}SO_2N(CH_3)CH_2CH_2O_2CCH=CH_2$

[15] 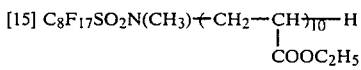

These compounds of the present invention may be readily synthesized in accordance with those synthesizing methods described in Japanese Patent Examined Publication No. 39291/1977, and the like.

The solubility parameter (hereinafter abbreviated to S.P.) of the solvent used in the present invention is the square root of the cohesive energy density (hereinafter abbreviated to CED) as described in J. Brandrup, E. H. Imergut edited "Polymer Handbook" 2ed. J. Wiley &. Sons (New York 1975) Chap. IV p. 337–359, the CED being expressed in the unit of $[cal/cm^3]^{\frac{1}{2}}$ by the value of $\delta$ given in the formula:

$$(SP)^2 = \delta^2 = CED = \frac{\Delta E}{V} = \frac{\Delta H - RT}{V} \quad \text{Formula (III)}$$

wherein $\Delta E$ is evaporation energy, V is mole value, $\Delta H$ is evaporation latent heat, R is gas constant, and T is absolute temperature.

The value of this solubility parameter (S.P.) may be determined by calculating using the value of the $\Delta H$ given in the Kagakubinran (Handbook of Chemistry) edited by the Chemical Society of Japan, published by Maruzen Co., Ltd.

S.P. values obtained with respect to various solvents are described in the above-mentioned Polymer Handbook. And in the case of those solvents consisting of multiple components, as described in the Journal of Polymer Science by R. L. Scott and M. Magat, Vol, 4, on and after p. 555 (1949), the S.P. is the total of the products of the S.P. values ($\delta i$) of the respective components and the volume fraction (Vi) thereof with respect to all the components, which is given by the formula:

$$\delta = \sum_{i=1}^{n} \delta_i V_i = \delta_1 V_1 + \delta_2 V_2 + \ldots + \delta_{n-1} V_{n-1} + \delta_n V_n \quad \text{Formula (IV)}$$

$$(V_1 + V_2 + \ldots + V_{n-1} + V_n = 1)$$

Further, the boiling point of the solvent used in the present invention is the boiling point under 1 atmosphere of air pressure.

The boiling point of the solvent used in the present invention under 1 atmosphere of air pressure is from 100° to 200° C. If this boiling point is less than 100° C., the difference in temperature between the support and the surface of the light-sensitive layer formed by the coating increases in the course of drying, tending to cause a drying unevenness, while if the boiling point exceeds 200° C. the time required for drying becomes elongated, and the coating property becomes worse due to the increased viscosity. Concrete examples of the solvent applicable to the present invention include, e.g., n-butyl alcohol, methyl-propyl ketone, methyl-butyl ketone, diethyl ketone, cyclohexanone, cyclohexanol, toluene, xylene, monochlorobenzene, o-, m- or p-dichlorobenzene, 1,2,-di-bromoethane, ethyl cellosolve, methyl cellosolve, butyl cellosolve, phenyl cellosolve, methyl cellosolve acetate, ethyl cellosolve acetate, dimethyl formamide, dimethyl sulfoxide, water, and the like. These solvents may be suitably used singly or in the form of a mixture. Among these solvents particularly preferred ones are cyclohexanone and cellosolve derivatives such as the ethyl cellosolve, methyl cellosolve, methyl cellosolve acetate, ethyl cellosolve acetate, and the like.

The above solvents will remain slightly in the light-sensitive layer even after drying. For example, the light-sensitive layer is removed dissolving from the support by using an organic solvent such as γ-butylolactone or the like, and the solution is filtered to obtain a filtrate, which is then analyzed by such methods as the gas chromatography mass spectrometry method (GC/MS method), gas chromatography Fourier transform infrared analysis method (GC/FT-IR method), and the like.

A support suitable for use in producing the light-sensitive lithographic printing plate of the present invention includes an aluminum plate, such a metallic plate as of zinc, copper, and the like, a zinc-, copper-, or chromium-deposited metallic plate, paper, plastics, a metal-deposited paper or plastic film, and the like. Most preferred one among these materials is an aluminum plate. Particularly in the case of a support such as an aluminum plate, it is desired to be subjected to a surface treatment such as a graining treatment, anodic oxidation treatment, and, if necessary, sealing treatment, and the like. For the above graining treatment, there may be applied to the degreased surface of an aluminum plate such techniques as the brushing graining method, ball-graining method, chemical graining method, electrolytic etching method, and the like. The above-mentioned anodic oxidation treatment may be carried out, for example, by energizing an aluminum plate or the like as an anode placed in an aqueous solution or non-aqueous liquid consisting of a single or a mixture of not less than two of inorganic acids such as phosphoric acid, chromic acid, boric acid, sulfuric acid, and the like or organic acids such as oxalic acid, sulfamic acid, and the like. Further, the above-mentioned sealing treatment may be effected by immersing an aluminum plate or the like into an aqueous sodium silicate solution or a hot water and a hot aqueous solution containing some amount of an inorganic salt or an organic salt, or by placing an aluminum plate or the like in a steam bath.

The light-sensitive composition used in the present invention comprises a light-sensitive material. As the light-sensitive material applicable to the present invention, any material can be used if it is capable of producing a difference in the solubility to a developing solution between the exposed and unexposed areas.

Typical examples of such materials are described below: Firstly, a conventionally known positive working type light-sensitive material of the quinone-diazide type such as o-naphthoquinone-diazide compound is given. A suitably usable o-naphthoquinone-diazide compound is the ester of naphthoquinone-(1,2)-diazido-(2)-sulfonic acid chloride with phenol or cresol formaldehyde resin as described in U.S. Pat. No. 3,046,120. Other effectively usable o-naphthoquinone-diazide compounds include, for example, the ester of pyrogallol-acetone resin with naphthoquinone-diazido-sulfonic acid chloride as described in U.S. Pat. No. 3,635,709; the ester of polyhydroxyphenyl resin with o-naphthoquinone-diazido-sulfonic acid chloride as described in Japanese Patent O.P.I. Publications No. 76346/1980, No. 1044/1981 and No. 1045/1981; those obtained by the esterification reaction of the homopolymer of p-hydroxystyrene or the copolymer thereof and other copolymerizable monomers with o-naphthoquinone-diazido-sulfonic acid chloride as described in Japanese Patent O.P.I. Publication No. 113305/1975; and the product of the reaction between the copolymerization product of a styrene monomer with a phenol derivative and o-quinone-diazido-sulfonic acid as described in Japanese Patent Examined Publication No. 17481/1974 and the ester of polyhydroxybenzophenone with o-naphthoquinone-diazido-sulfonic acid chloride.

The light-sensitive composition comprising the quinone-diazide type light-sensitive material preferably comprises a binder material, a suitable example of which is, for example, an aqueous alkaline solution-soluble novolak resin. Typical examples of the novolak resin include, e.g., phenol-formaldehyde resin, cresol-formaldehyde resin, p-tert-butyl-phenyl-formaldehyde resin, phenol-modified xylene resin, and the like. The quinone-diazide compound content of the composition is from 10 to 50% by weight and more preferably from 20 to 40% by weight. The above-mentioned binder material content in the composition is from 45 to 80% by weight and preferably from 50 to 70% by weight.

As the light-sensitive material applicable to the present invention, there may also be used a diazo type material. A desirable diazo type material is a diazo resins represented by the condensation product of an aromatic diazonium salt with an aldehyde. A particularly preferred one is a salt of the condensation product between p-diazodiphenylamine and formaldehyde or acetaldehyde, such as, for example, an inorganic salt of a diazo resin which is the product of the reaction between hexafluorophosphate, tetrafluoroborate, a perchloride or periodide and the foregoing condensation product or an organic salt of a diazo resin which is the product of the reaction between the foregoing condensation product and sulfonic acid as described in U.S. Pat. No. 3,300,309. Further, the light-sensitive composition comprises preferably a binder material. As the binder material there may be used various macromolecular compounds which include as preferred ones those copolymers of aromatic hydroxyl group-having monomers such as, e.g., N-(4-hydroxyphenyl)acrylamide, N-(4-hydroxyphenyl)methacrylamide, o-, m- or p-hydroxystyrene, o-, m- or p-hydroxyphenyl methacrylate and the like with other monomers as described in Japanese Patent O.P.I. Publication No. 98613/1979, polymers containing as the principal repetitive units thereof hydroxyethyl acrylate units or hydroxyethyl methacrylate units as described in U.S. Pat. No. 4,123,276, natural resins such as shellac, rosin, and the like, and polyvinyl alcohol, polyamide resins as described in U.S. Pat. No. 3,751,257; and linear polyurethane resins as described in U.S. Pat. No. 3,660,097, polyvinyl alcohol-phthalated resins, those epoxy resins condensed from bisphenol A and epichlorohydrin, celluloses such as cellulose acetate, cellulose acetate phthalate, and the like.

As the light-sensitive material applicable to the present invention there may also be suitably used light-sensitive polymers, which contain

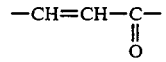

as a light-sensitive group in the principal chain and/or the side chain thereof, as polyesters, polyamides, polycarbonates. For example, the light-sensitive polyester obtained by the condensation reaction of phenylenediethyl acrylate, hydrogenated bisphenol A and triethylene glycol as described in Japanese Patent O.P.I. Publication No. 40415/1980; and the light-sensitive polyesters derived from (2-propylidene)malonic acid compounds such as cinnamylidenemalonic acid the like, and bifunctional glycols as described in U.S. Pat. No. 2,956,878.

Further, as the light-sensitive material applicable to the present invention, there may also be used those aromatic azide compounds in which an azide group is combined directly or through carbonyl or sulfonyl group with an aromatic ring, which include, for example, polyazidostyrene, polyvinyl-p-azidobenzoate, and polyvinyl-p-azidobenzal as described in U.S. Pat. No.

3,096,311; the product of the reaction between azidoacryl-sulfanyl chloride and an unsaturated hydrocarbon polymer as described in Japanese Patent Examined Publication No. 9613/1970; and those polymers having sulfonyl-azide or carbonyl-azide as described in Japanese Patent Examined Publications No. 21067/1968, No. 229/1969, No. 22954/1969 and No. 24915/1970.

Furthermore, as the light-sensitive material applicable to the present invention, photopolymerizable unsaturated compounds may also be used. And those light-sensitive compositions for use in the direct printing plate making process may also be utilized, which include, for example, those light-sensitive compositions composed of electron-donative compounds, phthalocyanine pigments and phenol resins for use in the lithographic original plate that utilizes the electrophotographic process as described in Japanese Patent O.P.I. Publication No. 161250/1980.

As methods for coating the light-sensitive composition of the present invention there may be used such methods as dip-coating, roll-coating, reverse-roll-coating, air-doctor-coating, blade-coating, rod-coating, knife-coating, squeeze-coating, gravure-coating, cast-coating, curtain-coating, extrusion-coating methods, and the like. The coating quantity after drying is desirable to be from 0.1 to 5 g/m$^2$ and more desirable to be from 0.5 to 3.5 g/m$^2$. The drying temperature is to be from 20° to 150° C., and preferably from 30° to 100° C.

In accordance with the present invention, a light-sensitive lithographic printing plate having a light-sensitive layer with an even thickness may be obtained without having any reverse effect upon the developability only by adding as small a quantity of the compound of the present invention as less than 0.05% by weight to a light-sensitive composition.

Into the light-sensitive composition used in the present invention may be further incorporated a filling agent, coloring matter, dye, pigment, surfactant for improving the coatability other than the compound of the present invention, and other commonly used additives and auxiliaries. Adding quantities of these additives, although differing according to the kind used, are generally from 0.01 to 20% by weight and preferably from 0.05 to 10% by weight to the composition.

Those dyes suitably applicable to the present invention include basic dyes and oil-soluble dyes, concrete examples of which include basic dyes such as Victoria Pure Blue BOH, Victoria Blue BH, Methyl Violet and Eisen Malachite Green (manufactured by Hodogara Chemical Co., Ltd.), Patent Pure Blue VX, Rhodamine B and Methylene Blue (manufactured by Sumitomo Chemical Co., Ltd.), and oil-soluble dyes such as Sudan Blue and Victoria Blue F4R (manufactured by BASF), Oil Blue #603, Oil Blue BOS and Oil Blue II N (manufactured by Orient Chemical Co., Ltd.).

The present invention is illustrated in detail in reference to examples below, but the present invention is not limited thereto.

EXAMPLE 1

A 0.24 mm-thick aluminum plate which has been subjected to a graining treatment by the electrolytic etching method, then to an anodic oxidation treatment and further to a hot water-sealing treatment, was coated thereon with the following coating solution by the dip-coating method, and then dried, whereby a light-sensitive lithographic printing plate free of unevenness and having the layer thereof with an even thickness was obtained.

| | | |
|---|---|---|
| Product of the esterification of naphthoquinone-(1,2)-diazido-(2)-5-sulfonic acid chloride with m-cresol-formaldehyde resin | 1 | part by wt. |
| Phenol-m-, p-mixed cresol-formaldehyde cocondensation product (as described in the example of Japanese Patent O.P.I. Publication No. 57841/1980) | 2.5 | parts by wt. |
| Victoria Pure Blue BOH (manufactured by Hodogaya Chemical Co., Ltd.) | 0.14 | part by wt. |
| Exemplified Compound (13) | 0.001 | part by wt. |
| Ethyl cellosolve | 24 | parts by wt. |

A positive halftone-dot photograph original was superposed on and contacted with the light-sensitive lithographic printing plate, which was then exposed for 70 seconds to a 2 KW metal halide lamp light under the condition of 8.0 mW/cm$^2$. When this was developed by being immersed in a 4% aqueous sodium metasilicate solution for 45 seconds at 25° C., then the exposed portion was completely dissolved to be removed by water-washing only, so that no rubbing-off procedure was necessary. When the thus obtained printing original plate was applied to an offset printing press for printing operation, then no scumming was found even after printing 10,000 copies, thus obtaining satisfactorily printed copies.

Control 1

A light-sensitive lithographic printing plate was obtained in quite the same prescription as in Example 1 with the exception that the Exemplified Compound (13) in Example 1 was not added thereto.

Control 2

A light-sensitive lithographic printing plate obtained in quite the same prescription as in Example 1 with the exception that in place of the Exemplified Compound (13) in Example 1 as a typical polyacrylic acid type polymer fluorinated surfactant, polyheptafluoroisopropyl acrylate (weight average molecular weight of 40,000) in the quantity of 0.5 part by weight was used was subjected to an exposure and a development in the same manner as in Example 1, and then was applied to a printing procedure in like manner. In addition, the above-mentioned polyheptafluoroisopropyl acrylate may be readily synthesized by those skilled in the art in accordance with the synthesis method as described in, e.g., the Journal of Polymer Science part A, vol. 6, p. 1738 (1968) by A. G. Pittman, D. L. Sharp and B. A. Ludwig.

Control 3

A light-sensitive lithographic printing plate obtained in quite the same prescription as in Example 1 with the exception that in place of the Exemplified Compound (13) in Example 1, part by weight ethyl cellulose (manufactured by Tokyo Kasei K.K.) was used was subjected to an exposure and a development in the same manner as in Example 1 and was applied to a printing operation.

The results obtained in above are shown in Table 1

TABLE 1

| Pre-scription | Adding quantity (% by wt.) | Coated condition of light-sensitive layer | Developing condition | Printing performance |
|---|---|---|---|---|
| Example 1 | 0.027 | With no unevenness | Good | Good |
| Control 1 | 0 | Streaky unevenness appeared | — | — |
| Control 2 | 12.1 | With no unevenness | Stripping development | Scumming appearred after printing 10,000 copies |
| Control 3 | 21.6 | With no unevenness | Same as above | Same as above |

As apparent from Table 1, it is found that the compound of the present invention, even though in an extremely small adding quantity, exhibits a sufficient effect to carry out an even coating, and enables to obtain satisfactorily printed copies without having any reverse effect upon the developing condition.

EXAMPLE 2

A 0.24 mm-thick aluminum plate which has been subjected to a graining treatment by the electrolytic etching method, then to an anodic oxidation treatment, and further to a sealing treatment in an aqueous sodium metasilicate solution was coated thereon with the following coating solution in the same manner as in Example 1, and then dried, whereby a light-sensitive lithographic printing plate having a light-sensitive layer free of any drying unevenness and having an even thickness.

| | |
|---|---|
| N—(4-hydroxyphenyl)methacrylamide-arylonitrile-methyl methacrylate-methacrylic acid copolymer (as described in Example 2 of Japanese Patent O.P.I. Publication No. 98614/1979) | 1 part by wt. |
| Perchlorate of the condensation product of p-diazo-diphenylamine with formaldehyde | 0.1 part by wt. |
| Oil Blue #603 (manufactured by Orient Chemical Co., Ltd.) | 0.02 part by wt. |
| Exemplified Compound (9) | 0.0001 part by wt. |
| Methyl cellosolve | 20 parts by wt. |
| Dimethyl formamide | 1 part by wt. |

The obtained light-sensitive lithographic printing plate was then brought into contact with a step tablet and was exposed for 30 seconds to a 2 KW metal halide lamp light under the condition of 8.0 mW/cm². This was subsequently developed in a developer having the following composition for 45 seconds at 25° C., then the unexposed portion was completely dissolved to be removed, so that no rubbing-off procedure was necessary.

| | |
|---|---|
| Benzyl alcohol | 40 g |
| Sodium carbonate | 5 g |
| Sodium sulfite | 5 g |
| Solfit (3-methyl-3-methoxy-butanol manufactured by Kuraray Co., Ltd.) | 80 g |
| Water | 1,000 ml |

The thus obtained printing original plate was applied to an offset printing press to perform a printing operation, no scumming appeared even after printing 10,000 copies, whereby satisfactorily printed copies were obtained.

In contrast to this, a light-sensitive lithographic printing plate was prepared in quite the same prescription except that repellent silicone YSW6617 (manufactured by Toshiba Silicone Co., Ltd.) in the quantity of 1% by weight was used in place of the Exemplified Compound (9), but the coating solution was repelled on the surface of the plate, so that a number of uncoated spots appeared.

EXAMPLE 3

A same aluminum plate as in Example 1 was coated thereon with a coating solution having the following composition in like manner, and then dried, whereby a light-sensitive lithographic printing plate having a light-sensitive layer free of any coating unevenness and having an even form thickness was obtained.

| | | |
|---|---|---|
| Light-sensitive polyester, the condensation product of phenylene-diethyl acrylate, hydrogenated bisphenoland triethylene glycol (as described in Example 1 of Japanese Patent O.P.I. Publication No. 40415/1980) | 1 | part by wt. |
| 2-di-benzoyl-methylene-3-methyl-naphthothiazoline | 0.05 | part by wt. |
| Phthalocyanine pigment | 0.2 | part by wt. |
| Exemplified Compound (13) | 0.0001 | part by wt. |
| Cyclohexanone | 25 | parts by wt. |

The obtained light-sensitive lithographic printing plate was brought into contact with a negative original and was exposed for 30 seconds from the distant of 75 cm to a 3 KW high pressure mercury vapor lamp light and was then developed in a mixture solution of γ-butylolactone and phosphoric acid, then the unexposed portion was completely dissolved to be removed, so that no rubbing-off procedure was necessary. In contrast to this, another light-sensitive lithographic printing plate obtained by preparing in quite the same prescription with the exception that the Exemplified Compound (13) was not used produced a streaky coating unevenness.

EXAMPLE 4

A same aluminum plate as in Example 1 was coated thereon with a coating solution having the following composition and then dried, whereby a light-sensitive lithographic printing plate having a light-sensitive layer free of any coating unevenness and having an even thickness was obtained.

| | | |
|---|---|---|
| β-type copper phthalocyanine pigment chromophthal blue 4GN (manufactured by Ciba Geigie) | 1 | part by wt. |
| Oxathiazole compound (as described in Example 1 of Japanese Patent O.P.I. Publication NO. 161250/1980) | 0.7 | part by wt. |
| m-cresol-formaldehyde resin | 6 | parts by wt. |
| Exemplified Compound (15) | 0.0015 | part by wt. |
| Aerosol OT | 0.01 | part by wt. |
| Ethyl cellosolve | 30 | parts by wt. |

The obtained sample was subjected to a corona discharge in the dark so that the surface potential thereof becomes 130 V, and was exposed through a negative original to a tungsten light (40 lux. sec). After that, the exposed sample was subjected to a reversal development with Mitsubishi Diafaxmaster LOM-ED toner (manufactured by Mitsubishi Paper Mills, Ltd.) and was then immersed into a 3% aqueous sodium metasilicate solution, then the toner-free portion of the light-sensitive layer was completely dissolved to be removed by water-washing alone.

What is claimed is:

1. A light-sensitive lithographic printing plate containing a light-sensitive composition which has a different degree of solubility in an exposed area of said printing plate than in an unexposed area of said printing plate when said printing plate is developed in an developing solution, said printing plate being produced by a process which comprises coating on a support having a metallic surface a solution prepared by dissolving a light-sensitive composition containing a light-sensitive material and at least one fluorinated surfactant having Formula (I) in a quantity of between 0.005% by weight and 0.05% by weight based on the weight of said composition, in at least one solvent having (A) a solubility parameter of at least $8(cal/cm^3)^{\frac{1}{2}}$, and (B) a boiling point within the range of from 100° to 200° C., said Formula (I) being Rf—A—Y, wherein Rf is a partially or completely fluorinated hydrophobic alkyl moiety, A is a single bind or a bivalent moiety and Y is a hydrophilic moiety.

2. The light-sensitive lithographic printing plate of claim 1, wherein at least one of said solvents is represented by Formula (II);

$$\begin{array}{c} R_1-O-CH_2 \\ | \\ R_2-O-CH_2 \end{array} \quad (II)$$

wherein $R_1$ is selected from the group consisting of a hydrogen atom, an acetyl group and a propionyl group; and $R_2$ is selected from the group consisting of a hydrogen atom, a methyl group, an ethyl group, a butyl group and a phenyl group.

3. The light-sensitive lithographic printing plate of claim 2, wherein at least 50% by weight of said solvent is a solvent represented by Formula (II).

4. The light-sensitive lithographic printing plate of claim 1, wherein Rf is a partially or completely fluorinated alkyl group having from 2 to 10 carbon atoms.

5. The light-sensitive lithographic printing plate of claim 2, wherein Rf is a completely fluorinated alkyl group having from 6 to 9 carbon atoms.

6. The light-sensitive lithographic printing plate of claim 3, wherein Rf is a completely fluorinated alkyl group having from 6 to 9 carbon atoms.

7. The light-sensitive lithographic printing plate of claim 4, wherein Rf is a completely fluorinated alkyl group having from 6 to 9 carbon atoms.

8. The light-sensitive lithographic printing plate of claim 1, wherein A is a single bond or at least one group selected from the group consisting of a carbonyl group, a sulfonyl group, an amino group, an arylene group, an alkylene group, and an oxygen group.

9. The light-sensitive lithographic printing plate of claim 1, wherein Y is selected from the group consisting of an anionic group, a cationic group, a betaine group and a nonionic group.

10. The light-sensitive lithographic printing plate of claim 1, wherein the light-sensitive material is selected from the group consisting of a quinonediazide light-sensitive material a diazo type light-sensitive material and a light-sensitive polymer type material containing a $$-CH=CH-\underset{\underset{O}{\parallel}}{C}-$$

group as part of the main chain, or a side chain, or both the main chain and side chain of said polymer.

11. The light-sensitive lithographic printing plate of claim 8, wherein A is selected from the group consisting of sulfonylamino, carbonylamino, sulfonylaminoalkyl, carbonylaminoalkyl, and sulfonylaminoalkylaryl.

12. The light-sensitive lithographic printing plate of claim 1, wherein said solution further comprises a non-fluorinated surfactant.

13. The light-sensitive lithographic printing plate of claim 1, wherein said solvent is selected from the group consisting of cyclohexanone, ethyl cellosolve, methyl cellosolve, methyl cellosolve acetate and ethyl cellosolve acetate.

14. The light-sensitive lithographic printing plate of claim 1, wherein the solution is coated on said support in an amount sufficient to provide a dry coating of 0.1 to 5 $g/m^2$.

15. The light-sensitive lithographic printing plate of claim 14, wherein the dry coating is present in an amount of 0.5 to 3.5 $g/m^2$.

* * * * *